United States Patent [19]

Sakuma

[11] Patent Number: 5,429,068
[45] Date of Patent: Jul. 4, 1995

[54] DEPOSITION METHOD FOR COMPOUND SEMICONDUCTOR FORMING DEVICE

[75] Inventor: Yoshiki Sakuma, Kawasaki, Japan

[73] Assignee: Fujitsu Limited, Kanagawa, Japan

[21] Appl. No.: 137,765

[22] Filed: Oct. 19, 1993

[30] Foreign Application Priority Data

Oct. 20, 1992 [JP] Japan ................. 4-282005

[51] Int. Cl.[6] ............................................. C30B 26/16
[52] U.S. Cl. .................................... 117/88; 117/92; 117/103
[58] Field of Search ............... 117/88, 92, 93, 102, 117/104, 105, 906

[56] References Cited

U.S. PATENT DOCUMENTS 4,931,132  6/1990  Aspnes et al. .............. 156/601
5,296,088  3/1994  Kodama et al. ............ 156/613

FOREIGN PATENT DOCUMENTS 0152386   2/1985   European Pat. Off. .
1083597   3/1989   Japan .
2149534   11/1983  United Kingdom .

OTHER PUBLICATIONS

"OMVPE growth of GaInAs/InP and GaInAs/ GaI-nAsP quantum wells"; Kamei et al.; I. Cryst Growth 107 (1991), pp. 567–572.

"Effect of growth parameters on the interfacial structure of GaInAs/InP quantum wells"; Hergeth et al.; I. Cryst. Growth 107 (1991) pp. 537–542.

H. Kamei and H. Hayashi, Journal of Crystal Growth 107, 1991, pp. 567–572, North–Holland.

J. Hergeth et al., Journal of Crystal Growth 107, 1991, pp. 537–542, North–Holland.

Eric Tournie et al., Appl. Phys. Lett. 61(7), 17 Aug. 1992, pp. 846–848.

*Primary Examiner*—R. Bruce Breneman
*Assistant Examiner*—Felisa Garrett
*Attorney, Agent, or Firm*—Armstrong, Westerman Hattori, McLeland & Naughton

[57] ABSTRACT

A deposition method of a compound semiconductor forming a semiconductor device comprises the steps of; covering the surface of a compound semiconductor containing a V group element with a III group element with a thickness of one or more monolayers; and forming a second compound semiconductor containing a V group element different from said V group element on said III group element while utilizing said III group element as a protective film for preventing the desorption of said V group element.

10 Claims, 10 Drawing Sheets

—○— CHANGE IN H₂ PURGE TIME AFTER AsH₃
—●— CHANGE IN H₂ PURGE TIME AFTER TMIn

F I G. 13
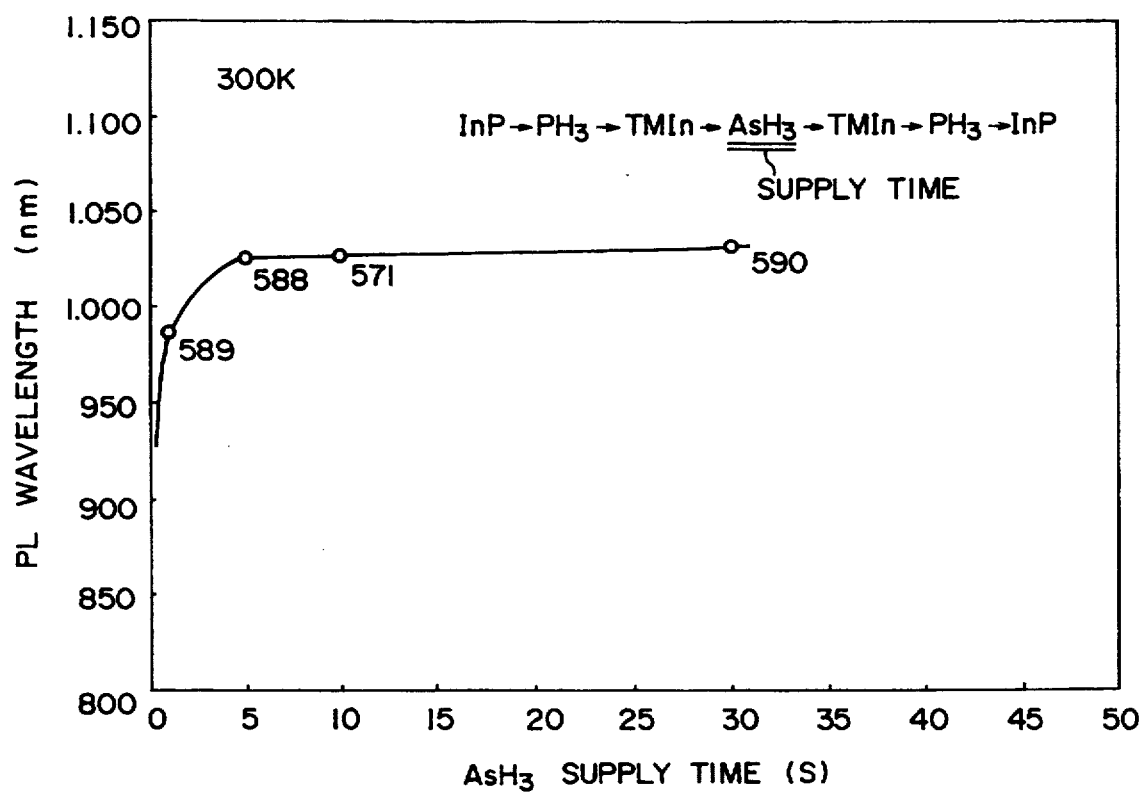

DEPOSITION METHOD FOR COMPOUND SEMICONDUCTOR FORMING DEVICE

BACKGROUND OF THE INVENTION

1. Field of the Invention

The present invention relates to a deposition method for a compound semiconductor forming semiconductor devices, and particularly to a deposition method for a semiconductor with a heterostructure forming compound semiconductor devices including photo devices such as a semiconductor laser and photodiode and electronic devices such as a HEMT (high electron mobility transistor) and MESFET (metal-semiconductor FET).

2. Description of the Related Art

Electronic devices and photo devices using III–V group compound semiconductors have been actively developed. For fabrication for these devices, the heterostructure in which different semiconductors are assembled by crystal growth is inevitably mounted. For example, in a distributed feedback laser (DFB laser), on the diffraction grating formed on the surface of a semiconductor layer, the crystal of a semiconductor must be grown without destroying the shape of the diffraction grating.

In deposition of the semiconductor with a heterostructure, since the optimum deposition temperature is dependent on the kinds of the materials, the temperature is often required to be changed during deposition. Further, in the case that the deposition is performed without change in the temperature, in switching the source gases, the already deposited semiconductor layer is exposed under high temperatures.

In common, in a III–V group compound semiconductor layer, part of the components, mainly, the atom of a V group element is easily desorbed within a range of crystal growth temperature. Accordingly, when a semiconductor having another composition is deposited thereon without any contrivance, a part of crystal is thermally dissociated, which generates the irregularities on the crystal surface, deteriorates the morphology of the semiconductor layer, and lowers the steepness of the change in the composition at the hetero interface. For example, the diffraction grating constituting a DFB laser is destroyed due to the heat dissociation, and the heat deterioration of the crystal obstructs the improvement in the device characteristic.

Conventionally, in the process of heating a III–V group compound semiconductor, for preventing the heat deterioration of the semiconductor crystal, the source gas of the V group element such as As (arsenic) and P (phosphorus) exist in an ambience surrounding the deposited semiconductor in a sufficient amount.

In particular, when vapor deposition is performed by changing the deposition temperature or switching source gases, a V group element is supplied for preventing the heat deterioration of a crystal. The method is described, for example, in the following literature:

[1] H. Kamei and H. Hayashi, Journal of Crystal Growth 107, 1991, pp. 567–572, North-Holland.

Next, the processes of deposition of an InGaAs layer on an InP layer will be described with reference to FIG. 1, FIGS. 2A to FIG. 2D. FIG. 1 is a sequence of gas supply in crystal deposited; and FIGS. 2A to FIG. 2D shows the states of layers grown according to the sequence of FIG. 1.

First, as shown in FIG. 2A, TMIn (trimethylindium) and $PH_3$ (phosphine) are supplied on an InP substrate 101, to deposit an InP layer 102. Next, as shown in FIG. 2B, the supply of TMIn is stopped, and the InP layer 102 is exposed in an ambience of $PH_3$. After that, as shown in FIG. 2C, the supply of gas is switched from $PH_3$ to $AsH_3$ (arsine), to expose the InP layer 102 in an ambience of $AsH_3$. Then, the mixed gas of $ASH_3$, TMIn and TEGa (triethylgallium) is supplied on the surface of the InP layer 102. Thus, as shown in FIG. 2D, an InGaAs layer 103 is deposited on the InP layer 102.

In this method, for example, as shown in FIG. 2C, P (phosphorous) is desorbed from the surface of the InP layer 102, or it is substituted by As (arsenic). For preventing this phenomenon, it may be considered to short the supply time of $AsH_3$.

However, even if the gas switching time is shortened, since P in the InP layer 102 reacts with As or $AsH_3$ in the ambience, it is difficult to prevent the desorption of P from the InP layer 102 which is essentially generated, and to prevent the reaction with the P and As, which has a limitation to the control of steepness at the hetero interface.

Further, as a result of examining the photoluminescence (PL) by changing the supply time of $AsH_3$ to the periphery of the InP layer, along with an increase in the supply time of $AsH_3$, the peak of the PL intensity is shifted on the lower photon energy side and the line width of the PL is broadened. This is reported by the following literature. Therefore, it becomes apparent that the supply time of $AsH_3$ for a long time cannot stabilize the surface of InP.

[2] J. Hergeth et al., Journal of Crystal Growth 107, 1991, pp. 537–542, North-Holland.

In addition, even in deposition of the InP layer on the InGaAs layer, the desorption of the As of the InGaAs layer and the reaction with As and P, $PH_3$ cannot be avoided.

SUMMARY OF THE INVENTION

An object of the present invention is to provide a deposition method for a compound semiconductor which, in a thermal process for crystal growth of a III–V group semiconductor, is capable of preventing the desorption of the atom of a V group element constituting the semiconductor from the surface of the crystal and the vicinity thereof, and the reaction with the atom of another V group element in an ambience surrounding the crystal one or more monolayers.

According to the present invention, mono-atom of a III group element or one or more molecules (the number of molecules is not limited to the integer, for example, 1.4 or 1.6 molecules) of a compound containing a III group element is deposited on a first semiconductor, and a second semiconductor is deposited thereon, which makes it possible to prevent the heat deterioration of the first semiconductor layer.

The present inventor has found the following fact: Namely, in the case that the atom of a V group element such as As or P contained in a semiconductor layer is exposed in an ambience, the atom is significantly desorbed from the semiconductor layer at high temperatures; however, in such a state that the surface of the semiconductor layer is covered with a III group element such as In, the desorption of a V group element constituting the semiconductor layer is significantly suppressed.

Accordingly, in crystal growth of the semiconductor, or in the other thermal process, by covering the uppermost surface of the semiconductor crystal as the underlayer with a III group element for preventing the desorption of the atom of a V group element and the reaction between the V group elements, it is possible to prevent the deterioration of the crystal, and to keep the steepness of the change in the composition at the hetero interface.

BRIEF DESCRIPTION OF THE DRAWINGS

FIG. 13 is a view showing the relationship between the supply time of AsH$_3$ according to Example 2 of the present invention and the photoluminescence peak.

DESCRIPTION OF THE PREFERRED EMBODIMENTS

Figure 1:
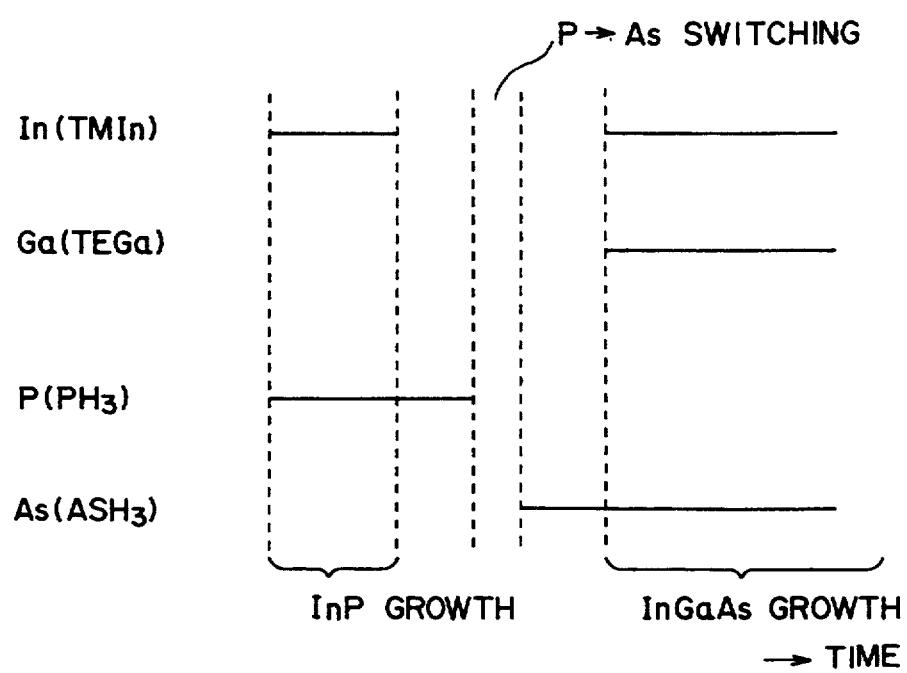
FIG. 1 is a switching sequence of gas supply for deposition of an InAs/InGaAs system film according to the prior art.
Figure 2A:
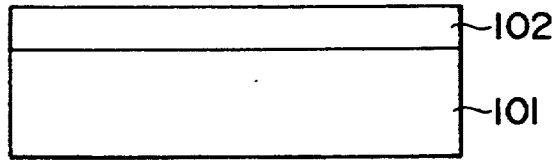
FIGS. 2A to 2D are sectional views showing the film deposition of an InAs/InGaAs system film according to the prior art.
Figure 2B:
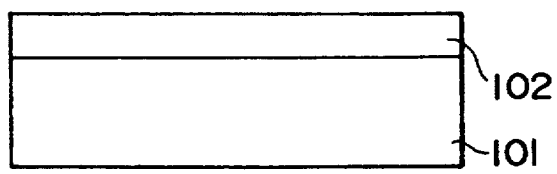
Figure 2C:
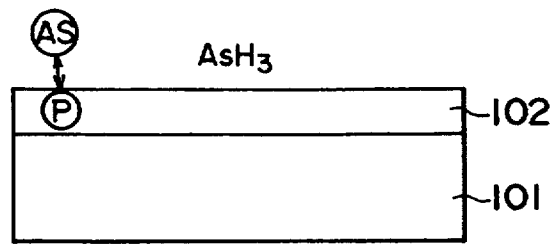
Figure 2D:
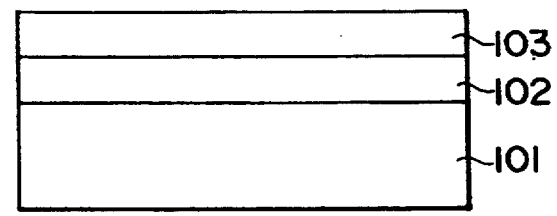
Figure 3:
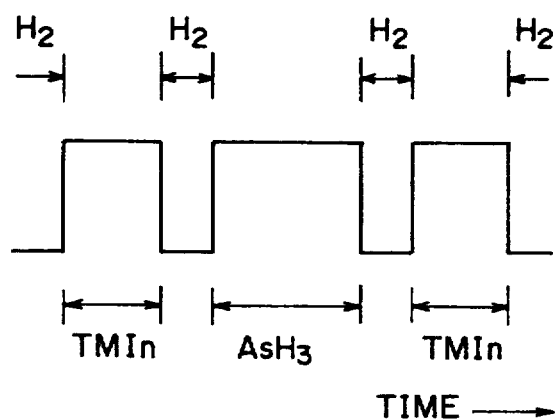
FIG. 3 is a switching sequence of gas supply for explaining the principle of the present invention.

FIG. 3 shows a switching flow chart for a source gas in formation of an InAs layer by atomic layer epitaxy (hereinafter, referred to as "ALE") using TMIn and AsH$_3$.

This flow chart shows the epitaxial growth of an InAs layer with a homo-structure by alternately supplying a TMIn gas and an AsH$_3$ gas, wherein in switching of these gases, the source gas before switching is purged by a hydrogen gas. In this case, the deposition temperature is specified at 400° C.

Figure 4:
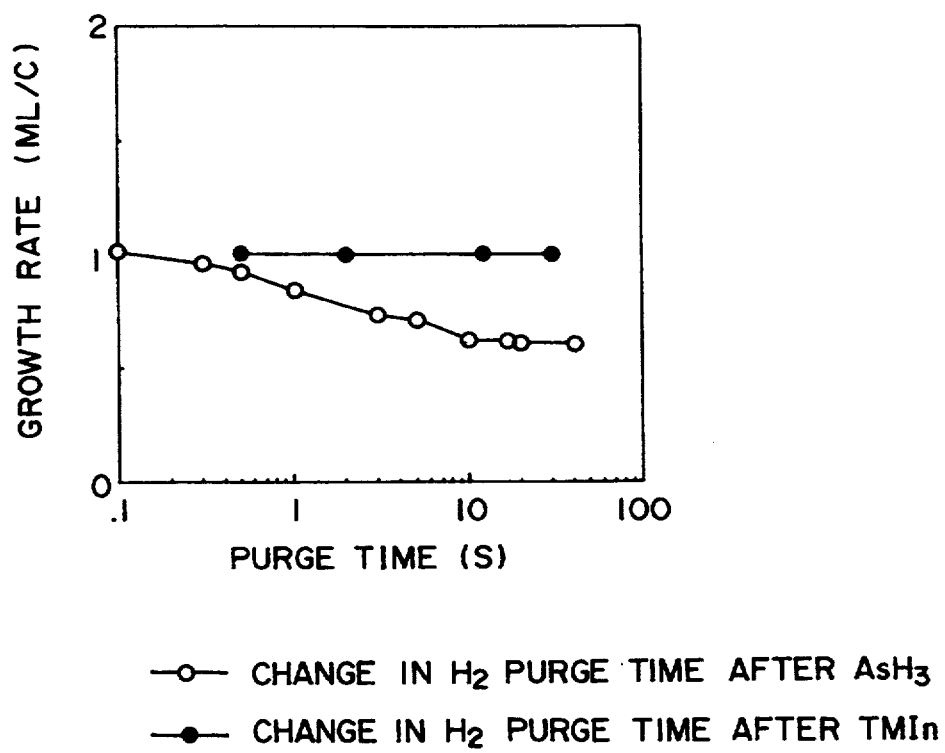
FIG. 4 is a characteristic view showing the relationship between the hydrogen purge time in the sequence of FIG. 3 and the InAs growth rate.

The hydrogen purge times for the TMIn gas and the As gas were independently changed. As a result, depending on the difference between the hydrogen purge times, there was obtained the change in the InAs growth rate as shown in FIG. 4. Additionally, in FIG. 4, the unit "KL/c" in the ordinate abbreviates "monolayer/cycle".

From the above result, in the state that As is exposed on the uppermost surface, along with an increase in the purge time by hydrogen, As is largely desorbed from the InAs layer, resulting in the reduced InAs growth rate. Further, the surface condition of a film fabricated in such a state is not preferable.

On the contrary, as shown in the relationship between the hydrogen purge time after supplying TMIn and the InAs growth rate, by covering the uppermost surface of the As atom with In, the lowering of the InAs growth rate due to the purge by hydrogen is never recognized, and the surface condition is preferable.

The result can be generalized for III–V group compound semiconductors. Namely, in a III–V group compound semiconductor, a V group element is larger in the vapor pressure than a III-group element, and tends to be desorbed.

In the microscopic viewpoint, of the V group elements, one present on the uppermost surface of the crystal is different in the activation energy of desorption from one present under the surface. The reason for this is that, the number of the coupling bonds of the V group element on the uppermost surface is less than that in the bulk.

Accordingly, in the thermal process including the crystal growth of a semiconductor, under the consideration of the desorption of a V group element, or substitution between V group elements, by exposing a III group element on the uppermost surface of the growth layer, it is possible to prevent the deterioration of the crystal, and to keep the steepness of the change in composition of the hetero interface.

The experiments have been made for fully examining the deposition condition of InAs and InP by atomic layer epitaxy. As a result, it was found that an As atom or P atom on the uppermost surface is significantly desorbed; however, in the state that a III group element such as In is deposited on the uppermost surface, the desorption of a III group element covered with In is significantly suppressed. The experimental result will be described as examples.

Example 1

Figure 5:
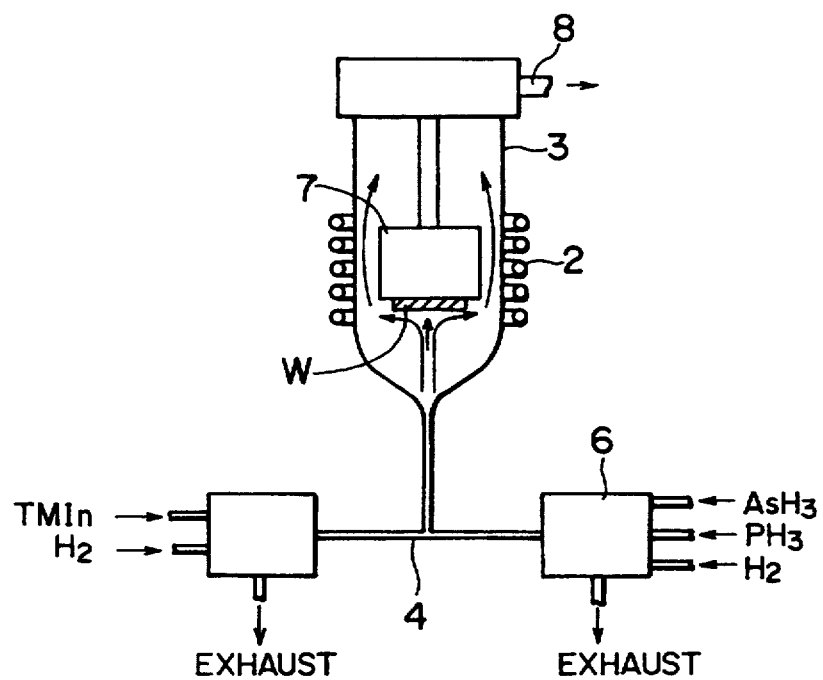
FIG. 5 is a construction view showing one example of an epitaxial growth apparatus.

FIG. 5 is a schematic construction view showing one example of a film deposition apparatus used in the present invention.

A vapor chimney type low pressure chemical vapor deposition apparatus 1 includes a reaction chamber 3 surrounded by a high frequency coil 2; a gas introducing tube 4 connected to a gas introducing port of the reaction chamber 3; two manifolds 5 and 6 connected to the gas introducing tube 4; a susceptor 7 for supporting a wafer W in the reaction chamber 3; and an exhaust tube connected to the reaction tube 3.

The first manifold 5 has a structure for supplying TMIn and hydrogen in the reaction chamber 3; and the second manifold 6 has a structure for supplying either AsH$_3$ or PH$_3$ and hydrogen in the reaction chamber 3. Further, gas flow rate adjusting valves (not shown) are respectively mounted on the gas upstream sides of these manifolds 5 and 6 for adjusting the flow rates of gases introduced in the reaction chamber 3.

Next, there will be described a fabrication example for an InAs/InP system single quantum well (hereinafter, referred to as "SQW") in which one monolayer of InAs is applied to the quantum well using the low pressure chemical vapor deposition apparatus.

Figure 6:
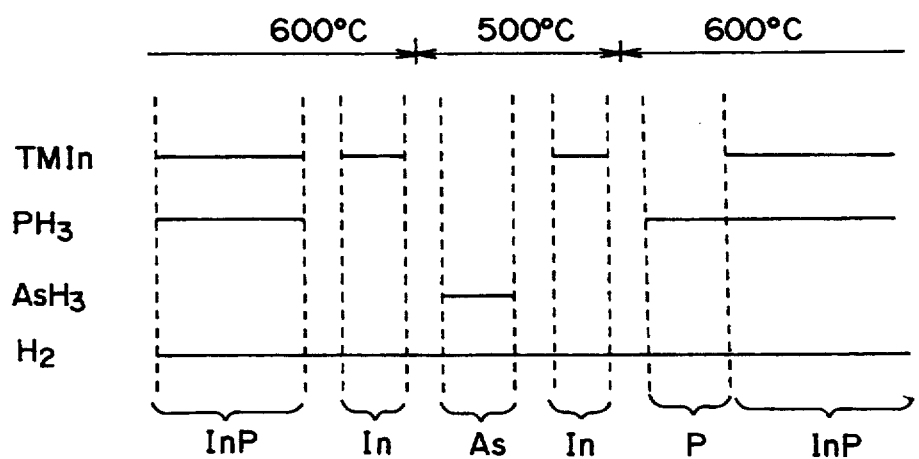
FIG. 6 is a switching sequence of gas supply for deposition of a single quantum well structure of an InAs/InP system according to Example 1 of the present invention.

FIG. 6 shows a switching sequence for supply of reaction gas in deposition of the single quantum well; and FIG. 7A to FIG. 7G shows layer structures in SQW deposition processes.

First, in the reaction chamber 3, an InP substrate 11 is supported by the susceptor 7 to be directed in the gas introducing port. The gas in the reaction chamber 3 is exhausted through the exhaust tube 8 to be reduced in pressure. After that, gas is introduced in the reaction chamber 3 according to the sequence as shown in FIG. 6 while keeping the internal pressure at 15 Torr.

Figure 7A:
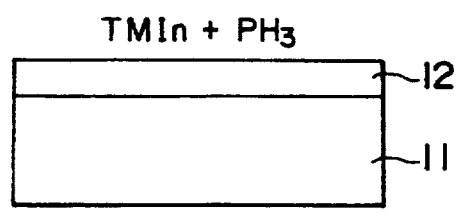
FIGS. 7A to 7F are sectional views showing the deposition of the single quantum well structure of the InAs/InP system according to Example 1 of the present invention.

As shown in FIG. 7A, a mixed gas of TMIn and $PH_3$ is supplied on the surface of the InP substrate 11, and an InP layer 12 as a barrier layer of SQW is deposited to a thickness of about 200 nm at a deposition temperature of 600° C. by metal organic chemical vapor deposition (hereinafter, referred to as "MOCVD"), after which the supply of the mixed gas is stopped. TMIn is introduced by a hydrogen carrier gas.

At the same time when the supply of the mixed gas is stopped, the mixed gas is purged by the hydrogen gas for 0.1 sec.

Figure 7B:
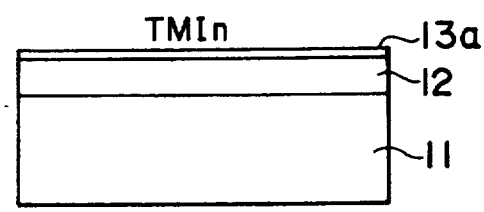

Subsequently, TMIn is supplied in pulse on the InP layer 12, and as shown in FIG. 7B, an In layer 13a is deposited by one monolayer through ALE. Thus, after the surface of the InP layer 12 is covered with the In layer 13a, the temperature in the reaction chamber 3 is lowered from 600° C. to 500° C. while supplying a hydrogen gas. In the process of lowering the temperature, since the InP layer 12 is covered with the In layer 13a, P is not desorbed from the surface. The reason thereof has already described.

Figure 7C:
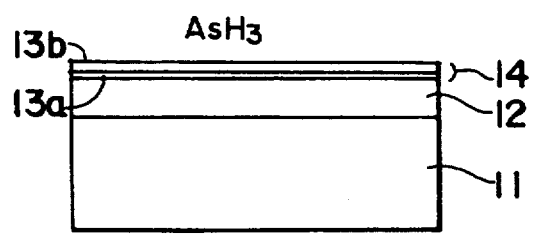

Then, as shown in FIG. 7C, $AsH_3$ is supplied in pulse on the In layer 13a, and an As layer 13b is deposited on the In layer 13a by one monolayer through ALE, after which the supply of $AsH_3$ is stopped. The As layer 13b and the In layer 13a thereunder constitute an InAs layer 14 of one molecule. The InAs layer 14 forms the well layer of SQW.

Figure 7D:
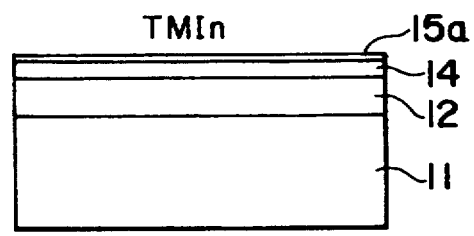

After the As layer 13b is deposited by one monolayer, $AsH_3$ is purged by hydrogen for 0.1 sec. Directly after the purge, as shown in FIG. 7D, TMIn is supplied in pulse to form an In layer 15a on the uppermost surface by one monolayer. Subsequently, the temperature in the reaction chamber 3 is again increased up to 600° C. while supplying the hydrogen gas. In this case, As is also not desorbed by the presence of the In layer 15a.

Figure 7E:
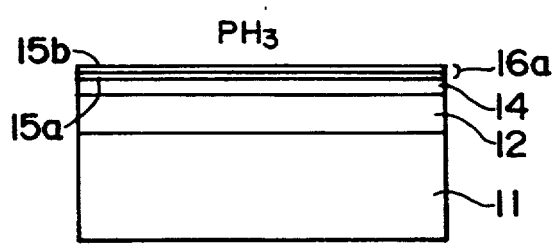
Figure 7F:
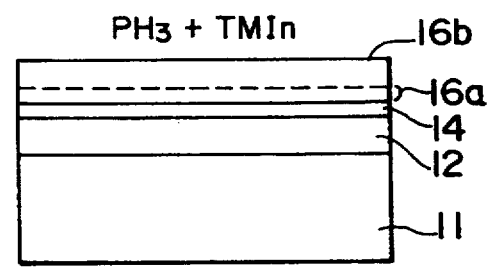

Next, $PH_3$ is supplied on the surface of the In layer 15a, and a P layer 15b is deposited on the surface of the In layer 15a by one monolayer. Thus, as shown in FIG. 7E, an InP layer 16a is formed. Subsequently, as shown in FIG. 7F, $PH_3$ and TMIn are supplied to deposit an InP layer 16b.

In addition, by use of ALE, each of In, As and P is formed by one monolayer through a self-limiting mechanism.

Figure 8:
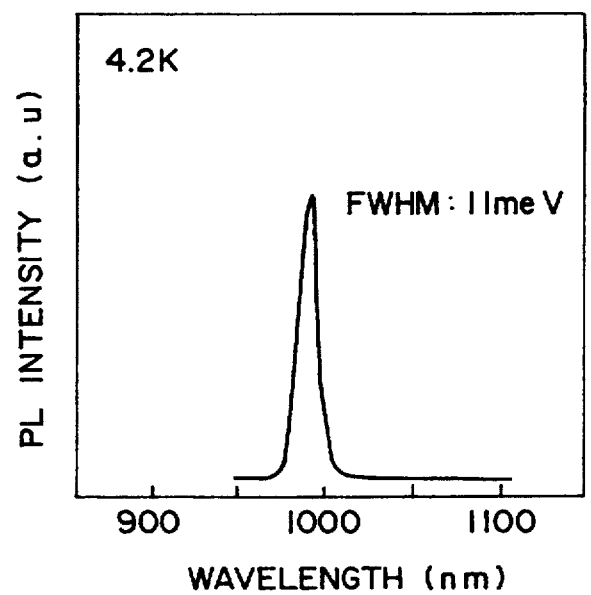
FIG. 8 is a view showing the relationship between the photoluminescence of the single quantum well structure formed by Example 1 of the present invention and the wavelength.

The sample crystal described above was examined for the photoluminescence spectrum at a temperature of 4.2K. As shown in FIG. 8, the very strong luminescence was observed in the vicinity of a wavelength of 1000 nm, which exhibited that the quantum well composed of the InAs layer 14 of one molecular thickness was not affected by the gas switching and the temperature change. Further, full widths at half maximum (hereinafter, referred to as "FWHM") of the spectrum as shown in FIG. 8 is 11 meV. In addition, by another experiment, 8 meV of FWHM is obtained. In the FWHM of the InAs in this embodiment is smaller than the FWHM of InAs of one molecular thickness according to the prior art. The value in the prior art is, for example, shown in FIG. 3 of the following literature, that is, the FWHM of InAs is 14 meV.

[3] Eric Tournie et al., Appl. Phys. Lett. 61(7), 17 Aug. 1992, pp. 846–848.

The reason why the FWHM of InAs in this embodiment is small is that, since the gas switching is performed in such a manner that the InP layer as a III–V group compound semiconductor is covered with the In layer 13a of one molecule, and the InAs layer 14 of one monolayer is covered with the In layer 15a of one monolayer, the In layers 13a and 15a function as the protective films, so that P or As is not desorbed in the purge by hydrogen, and further, in supply of the gas containing a V group element, the substitution between the V group elements is not performed, thus forming the well layer excellent in crystallinity.

Next, for comparison with the prior art, the processes of forming an InAs quantum well by MOCVD will be described.

Figure 9:
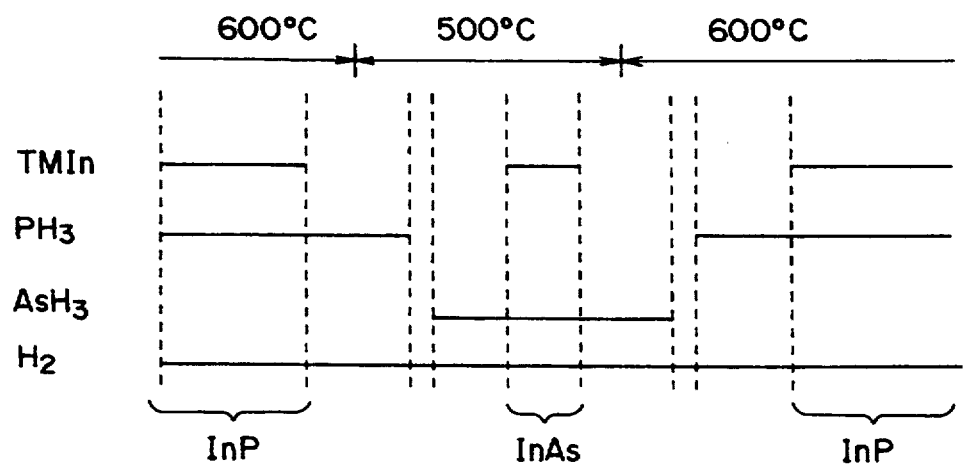
FIG. 9 is a switching sequence of gas supply for deposition of a single quantum well structure of an InAs/InP system according to the prior art.

FIG. 9 is a switching sequence for supply of source gas in MOCVD; and FIGS. 10A to FIG. 10F are views showing the deposition states of films.

Figure 10A:
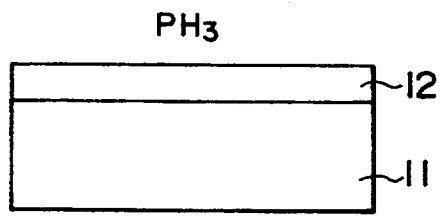
FIGS. 10A to 10F are sectional views showing the deposition of the single quantum well structure of the InAs/InP system according to the sequence of FIG. 9.
Figure 10B:
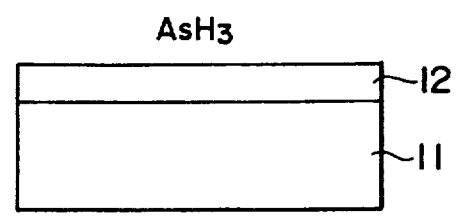
Figure 10C:
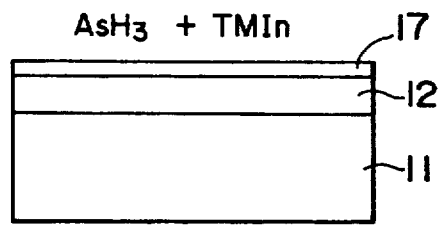

First, as shown in FIG. 10A, an In layer 12 is deposited on an InP layer 11 at 600° C., and the temperature in the reaction chamber 3 is reduced to 500° C. in a $PH_3$ ambience. $PH_3$ is then purged by hydrogen and is switched into $AsH_3$. Thus, as shown in FIG. 10B, the InP layer 12 is exposed in an ambience where the V group element is fully present. After that, as shown in FIG. 10C, TMIn is added to $AsH_3$ to deposit an InAs layer 17 of one molecule by MOCVD.

Figure 10D:
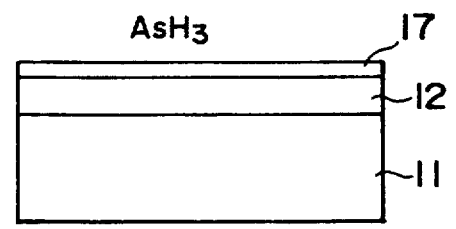

After the deposition of the InAs layer 17 is completed, as shown in FIG. 10D, the supply of TMIn is stopped, and the temperature is increased up to 600° C. while supplying $AsH_3$, and $AsH_3$ is purged by hydrogen.

Figure 10E:
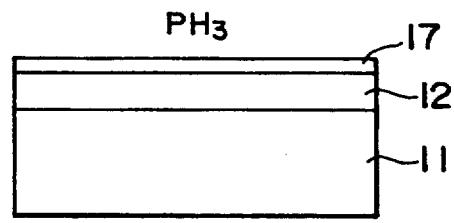
Figure 10F:
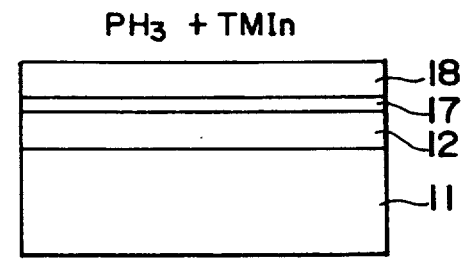

After that, as shown in FIG. 10E, the surface of the InAs layer 17 is exposed in $PH_3$, and the mixed gas of $PH_3$ and TMIn is introduced, and as shown in FIG. 10F, an InP layer 18 is formed.

Figure 11:
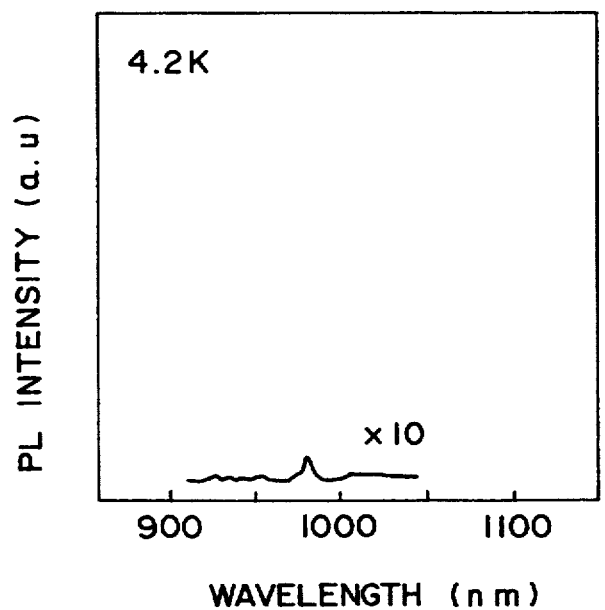
FIG. 11 is a view showing the relationship between the photoluminescence of the InAs/InP system according to the prior art and the wavelength.

The photoluminescence spectrum of this sample at a temperature of 4.2K is as shown in FIG. 11, which give the result in which the extremely weak photoluminescence intensity as compared with this embodiment is observed.

In the sample according to the prior art, after formation of the InAs layer 17 as the quantum well, when $AsH_3$ is purged by hydrogen at 600° C., As is desorbed from the InAs layer 17, to destroy the quantum well, and further, when the reaction gas is switched from $AsH_3$ to $PH_3$, As is substituted by P, to thus destroy the quantum well, as a result of which photoluminescence intensity is made weaker.

As described above, according to the present invention, a protective layer of a III group element is deposited on the surface of a semiconductor film from which a V group element is exposed, so that the deterioration of the crystal due to desorption of the V group element can be prevented. This semiconductor deposition method is extremely effective for fabrication of semiconductor devices using the excellent hetero interface and extremely thin film.

Example 2

In this example, the relationship between the time for which an InP layer covered with an In layer is exposed in an $AsH_3$ ambience and the photoluminescence peak will be described.

Figure 12A:
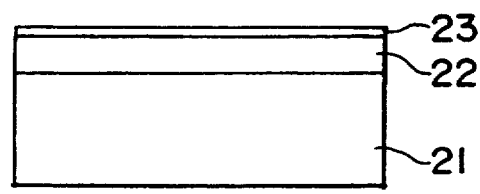
FIGS. 12A to 12D are sectional views showing the deposition of an InAs/InP according to Example 2 of the present invention.
Figure 12B:
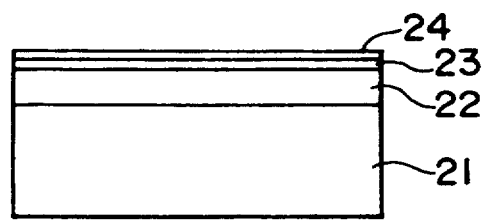

First, as shown in FIG. 12A, an InP layer 22 is formed on an InP substrate 21, after which the reaction gas is purged by hydrogen, and $PH_3$ is supplied to deposit a P layer 23 of one monolayer on the InP layer 22. $PH_3$ is purged by the hydrogen gas for 0.1 sec. After that, as shown in FIG. 12B, TMIn is supplied to form an In layer 24 on the P layer 23 by one monolayer. Then, the TMIn is purged.

Figure 12C:
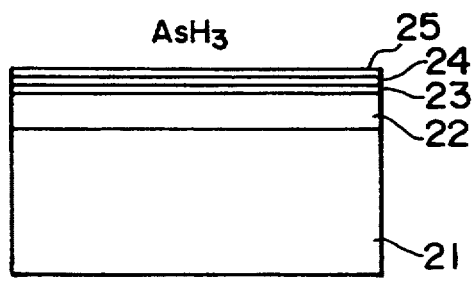
Figure 12D:
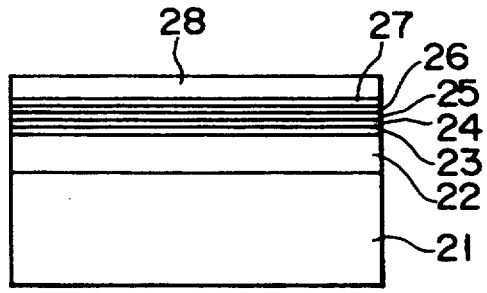

After that, as shown in FIG. 12C, $AsH_3$ is supplied on the In layer 24 to deposit an As layer 25 thereon, and then $AsH_3$ is purged by hydrogen. Subsequently, as shown in FIG. 12D, a TMIn gas is supplied on the As layer 25 to form an In layer 26 on the As layer 25 by one monolayer. After the purge by hydrogen $PH_3$ is supplied on the In layer 26 to form P layer 27 by one monolayer. Further, an InP layer is formed by supply of a mixed gas of TMIn and $PH_3$.

For the above layer structure, a plurality of samples obtained under the condition that the supply time for $AsH_3$ was changed in deposition of the As layer were examined for the wavelength corresponding to the peak of the photoluminescence, which gave the results as shown in FIG. 13. The wavelength was not changed even when the supply time for $AsH_3$ was to be more than 5 sec. Consequently, by supply of $AsH_3$ for more than 5 sec, the V group element under the As layer 25 is not desorbed or is not substituted by the other V group element. Accordingly, it is revealed that the In layer prevents the desorption of the V group element and the reaction between the V group elements, and the roughness on the surface of a semiconductor layer can be suppressed.

On the contrary, according to the prior art wherein the InP layer is not covered with In, for example, by the description regarding FIG. 2 in the literature [2] described above, along with an increase in the supply time for $AsH_3$ in order of second, the roughness of the surface morphology of InP is observed.

Other Examples

In the above examples, a III group element is deposited by one monolayer for forming the single quantum well structure; however, one or more monolayers may be deposited. In addition, as the III group element, Al, Ga and the like may be used other than In.

Further, in the above Examples, in formation of the In layer, the TMIn is used; however, triethylindium or triisobutylindium and the like may be used. Namely, in formation of the layer of a III group element, a gas containing at least one kind of methyl compound, ethyl compound, triisobutyl compound, tertiary butyl compound, chloride, and amino compound combined with the III group element is supplied on the surface of the crystal for a specified time, to thus form the protective film composed of an atom of a III group element.

In addition, when the atom of a III group element is supplied in the form of an organic material, the atom may remain on the surface as a molecular state combined with organic matter in the source material. At this time, the thickness of the layer at this time is one molecular layer or one or molecular layers such as 1.1, 1.2, 1.3 molecular layers.

What is claimed is:

1. A deposition method for forming a compound semiconductor device, comprising the steps of:
    forming a first crystal layer containing a first group V element;
    forming a protective layer, which is composed of at least one monolayer of a group III element, on said first crystal layer; and
    forming a second crystal layer on said protective layer using a gas containing a second group V element different from said first group V element.

2. A deposition method for a compound semiconductor forming a semiconductor device according to claim 1, wherein the deposition temperature extending from the deposition of said first crystal layer to the deposition of second crystal layer is varied.

3. The deposition method according to claim 1, wherein said protective layer contains an organic compound including a group III element when said protective layer is made from an organic material including said group III element.

4. The deposition method according to claim 1, wherein said group III element is In, Al, or Ga.

5. The deposition method according to claim 1, wherein said first crystal layer is an InP layer, said group III element is In, and said second group V element is As.

6. The deposition method according to claim 1, wherein said protective layer is formed by atomic layer epitaxy.

7. A deposition method for forming a compound semiconductor device, comprising the steps of:
    forming a first quantum barrier layer containing a first group V element;
    sequentially depositing a group III element with at least one monolayer and a second group V element with at least one monolayer by atomic layer epitaxy so as to form a quantum well on said first quantum barrier layer; and
    forming a second quantum barrier layer containing said first group V element on said quantum well.

8. The deposition method according to claim 7, wherein said group III element is In, Al, or Ga and said second group V element is As or P.

9. The deposition method according to claim 7, wherein said first quantum barrier layer is an InP layer, said group III element is In, said second group V element is As, and said second quantum barrier layer is an InP layer.

10. The deposition method according to claim 7, wherein said step for sequentially deposition a group III element and a second group V element is repeated at least twice.

* * * * *